(12) United States Patent
Zhu et al.

(10) Patent No.: US 7,523,422 B2
(45) Date of Patent: Apr. 21, 2009

(54) METHOD OF FABRICATING AN INTEGRATED CIRCUIT TO IMPROVE SOFT ERROR PERFORMANCE

(75) Inventors: Xiaowei Zhu, Plano, TX (US); Robert C. Baumann, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 11/683,278

(22) Filed: Mar. 7, 2007

(65) Prior Publication Data
US 2007/0157349 A1 Jul. 5, 2007

Related U.S. Application Data

(62) Division of application No. 11/030,273, filed on Jan. 6, 2005, now Pat. No. 7,234,121.

(51) Int. Cl.
*G06F 17/50* (2006.01)
*H03K 19/003* (2006.01)

(52) U.S. Cl. .................. 716/2; 716/4; 326/10

(58) Field of Classification Search ............ 716/2, 716/4; 326/10
See application file for complete search history.

(56) References Cited

U.S. PATENT DOCUMENTS

| 6,794,908 B2 | 9/2004 | Erstad |
| 2005/0156620 A1 | 7/2005 | Carlson |
| 2005/0179093 A1 | 8/2005 | Morris |

OTHER PUBLICATIONS

Hubert, G., et al. "Detailed Analysis of Secondary Ions' effect on the Calculation of Neutron—SRAMS", IEEE Trans, Nuclear Science, vol. 48, issue 6, Dec. 2001, pp. 1953-1959.

*Primary Examiner*—Vuthe Siek
*Assistant Examiner*—Magid Y Dimyan
(74) *Attorney, Agent, or Firm*—Rose Alyssa Keagy; Wade J. Brady, III; Frederick J. Telecky, Jr.

(57) ABSTRACT

The present invention provides, in one aspect, a method of designing an integrated circuit. In this particular aspect, the method comprises reducing soft error risk in an integrated circuit by locating a structure, relative to a node of the integrated circuit to reduce a linear energy transfer associated with a sub-atomic particle, into the node, such that the linear energy transfer does not exceed a threshold value associated with the integrated circuit.

4 Claims, 3 Drawing Sheets

METHOD OF FABRICATING AN INTEGRATED CIRCUIT TO IMPROVE SOFT ERROR PERFORMANCE

This is a division of application Ser. No. 11/030,273, U.S. Pat. No. 7,234,121, filed Jan. 6, 2005.

TECHNICAL FIELD OF THE INVENTION

The present invention is directed in general to a method of fabricating an integrated circuit and, more specifically, to a method of improving soft error performance in an integrated circuit through selective layer placement.

BACKGROUND

As the size of transistors descends further into the deep submicron range, integrated circuits are becoming increasingly susceptible to operational disturbances caused by fluctuations in the surrounding environment. These fluctuations are often referred to as "soft errors." It is believed that these soft errors are primarily produced by energetic particle strikes. By imparting unwanted charge into random nodes of an integrated circuit, these particle strikes can either toggle the states of storage elements or cause poorly-timed transient glitches that disrupt the latching of combinational results. In older technologies, this was not a significant problem, because the capacitances of the larger devices and the higher supply voltages were such that they could often absorb all of the energy of a single particle without changing their logic value. However, with ever shrinking geometries and higher-density circuits, the issue of soft errors and reliability in complex System on Chip (SoC) design is set to become an increasingly challenging issue for the industry as a whole.

There are a number of factors that contribute to present trends toward increasing soft-error rates. For example, high energy particles, such as cosmic radiation or alpha particles emanating from packaging materials can interfere with charges held within sensitive nodes in the circuit, thereby affecting the logic state. When these high energy particles strike a sensitive node region, they can cause a bit in the memory cell to change states or flip. These soft errors, which are also known as single-event upsets, generally affect storage elements, such as memory, latches and registers. As silicon process geometries shrink and systems become more complex, particle collision is more likely to impact the stored charge sufficiently enough to change its state. There is also mounting evidence to support the likelihood of more than one error occurring simultaneously, i.e., multi-bit errors.

In fact, it is generally believed that the frequency of system errors due to charged particle strikes is not insignificant. Soft error problems represent a considerable cost and reputation challenge for integrated chip manufacturers. In safety critical applications, for example space, military or medical equipment applications, unpredictable reliability can represent considerable risk, not only in terms of the potential human cost, but also in terms of corporate liability, exposing manufacturers to potential litigation. In commercial consumer applications, there is again significant potential economic impact to consider. For high-volume, low-margin products, high levels of product failure may necessitate the costly management of warranty support or expensive field maintenance. Once again, the effect on brand reputation may be considerable.

The integrated circuit industry has attempted to address this problem in a number of ways. For example, the industry has employed redundant operating systems, but while this solution is effective, it is quite expensive. Another attempted solution has been in the area of circuit design by increasing device capacitance, raising the supply voltage, or adding feedback loops to overcome any transient spikes on the input. The feedback loops in storage elements can be oversized to make them less likely to toggle states. Yet another has been software design to detect and correct the error. Any one of these actions, however, has a direct penalty in area, power, speed, or cost, all of which are less than complete solutions.

Accordingly, what is needed in the art is an improved method for reducing soft error effects without incurring the disadvantages associated with the method discussed above.

SUMMARY OF INVENTION

To address the above-discussed deficiencies of the prior art, the present invention provides, in one embodiment, a method of designing an integrated circuit. In this particular embodiment, the method comprises reducing soft error risk in an integrated circuit by locating a structure relative to a node of the integrated circuit to reduce a linear energy transfer associated with a sub-atomic particle into the node, such that the linear energy transfer does not exceed a threshold value associated with the integrated circuit.

In another embodiment, the present invention provides a method for fabricating an integrated circuit. This particular embodiment comprises configuring an optimized integrated circuit design by selectively locating interconnect structures relative to source/drain regions to reduce a linear energy transfer associated with sub-atomic particles into the source/drain regions such that the linear energy transfer does not exceed a threshold value associated with the integrated circuit and fabricating an integrated circuit based on the optimized integrated circuit design.

In yet another embodiment, the present invention provides an integrated circuit that comprises a semiconductor substrate having transistors located thereover, wherein each of the transistors has source/drain regions associated therewith, dielectric layers located over the transistors, and an interconnect structure interconnecting the transistors and being located on or in the dielectric layers, wherein at least a portion of the interconnect structure is located relative to the source/drain regions to reduce a linear energy transfer associated with sub-atomic particles into the source/drain regions such that the linear energy transfer does not exceed a threshold value associated with the integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the problems associated with soft errors that occur when sub-atomic particles encounter nodes within an integrated circuit and impart energy or a charge sufficient to change the logic state of one or more of the nodes. This can and does happen in memory circuits, such as static random access memory (SRAM) circuits and is occurring with more frequency as device sizes have reached well into the submicron range. The present invention presents a unique solution in solving this problem and one that does not suffer from the disadvantages associated with the prior art processes discussed above. The present invention comprises reducing soft error risk in an integrated circuit by locating a structure, such as a layer of material, an interconnect structure, a capacitor, inductor or resistor, relative to a node of the integrated circuit to reduce a linear energy transfer, which is associated with sub-atomic particles, into the node. The structure is located such that the linear energy transfer does not exceed a threshold value associated with the integrated circuit. Depending on the design, e.g., operating voltage, design layout, etc., of the integrated circuit, the threshold value may vary from one circuit to another. However, when the linear transfer energy remains at or below this threshold value, the chance of the logic state of the node switching or flipping is substantially reduced. In addition, it should be understood that even though the backside of the integrated circuit typically does not present a soft error problem in those designs that do not involve flip-chip technology, the present invention may also be applicable to the backside of the integrated circuit as well.

Figure 1:
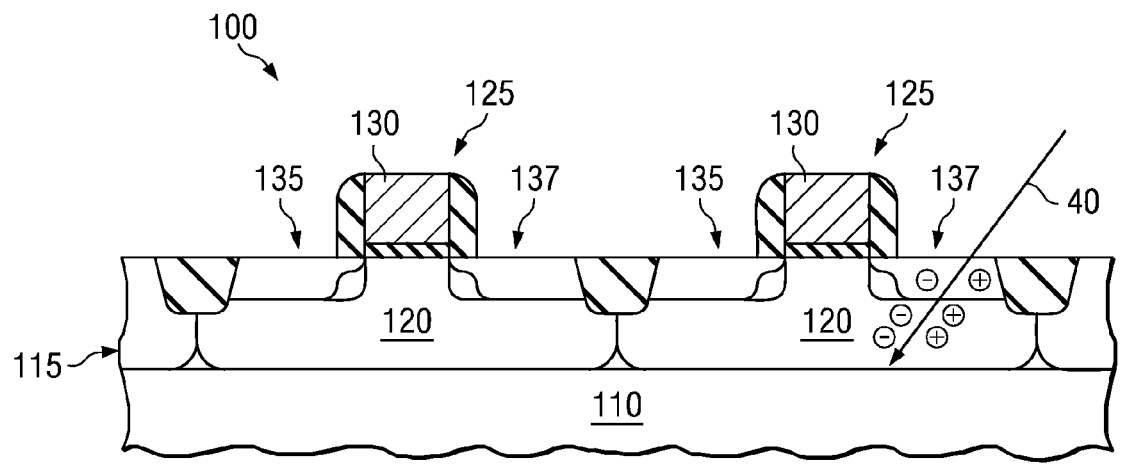
FIG. 1 illustrates a partial, sectional view of an exemplary integrated circuit at the device level showing a sub-atomic particle at a node of the integrated circuit.

Turing initially to FIG. 1, there is illustrated a partial, sectional view of an exemplary integrated circuit 100 at the device level. At this level, the integrated circuit 100 is of conventional design and includes a substrate 110, such as a semiconductive substrate of the types well known to those skilled in the art. The substrate 110 may be configured to serve as a well region for the integrated circuit 100, or it might have an epitaxial layer 115 located thereover in which wells 120 are formed. The wells 120 may be complementary wells, such as an N-type well and a P-type well, respectively, however, other doping configurations are also applicable.

The integrated circuit 100 further comprises conventional transistors 125, such as complementary NMOS and PMOS transistors, that may include gates 130 and source/drain regions 135, 137, respectively. These source/drain regions 135, 137 are often referred to as nodes, which is a term that will be used interchangeably herein for the source/drain regions 135, 137. As is well known, source/drain regions 135, 137 are doped regions that have differing types and concentrations of dopants in them, and it is these regions that are the most sensitive to charged sub-atomic particle radiation. For example, when a charged sub-atomic particle, such as an alpha particle, designated by line 140, strikes a node, for example the drain region 137, with a sufficient linear energy transfer rate (LET), the particle may inject a charge into the node such that it disrupts the state of the node to cause its state to flip. In those applications where the drain region 137 forms a portion of a memory device, the bits of data are stored within the device as one's and zero's, which are represented by differing charges. When there is a disruption of the energy state, the bits can flip from a one to a zero or vice versa, and this flip can result in a soft error within the memory device. This is further discussed and illustrated regarding FIG. 2.

Figure 2:
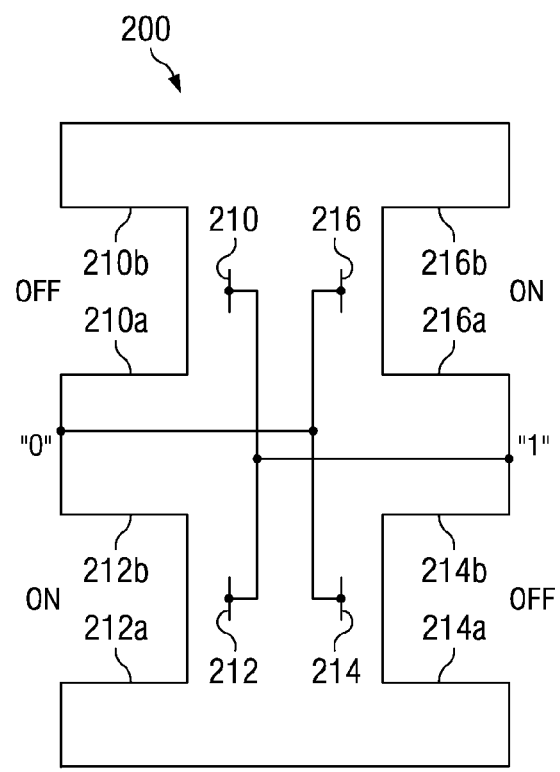
FIG. 2 is a schematic illustration of a memory circuit with which the present invention may be used and prior to sub-atomic particle impact.

Turning now to FIG. 2, there is schematically illustrated one embodiment of a memory circuit 200 with which the present invention may be used. As shown in this view, the memory circuit 200 has not encountered a strike by a charged sub-atomic particle. This particular memory circuit 200 comprises four gates 210, 212, 214 and 216 having source/drains, 210a/210b, 212a/212b, 214a, 214b, and 216a/216b, respectively. As mentioned above, the gates may be complementary NMOS and PMOS devices. For purposes of discussion only, gates 210 and 212 will represent a PMOS device and gates 214 and 216 will represent an NMOS device. Gates 214 and 216 are biased to have an "on"/"off" configuration such that the NMOS side of the memory circuit 200 has a "1" stored therein, and gates 210 and 212 are biased to have an "on"/"off" configuration such that the PMOS side of the memory circuit 200 has a "0" stored therein. When left undisturbed by outside sources, the memory circuit 200 will remain in this "on"/"off" configuration and properly maintain the bit information.

Figure 3:
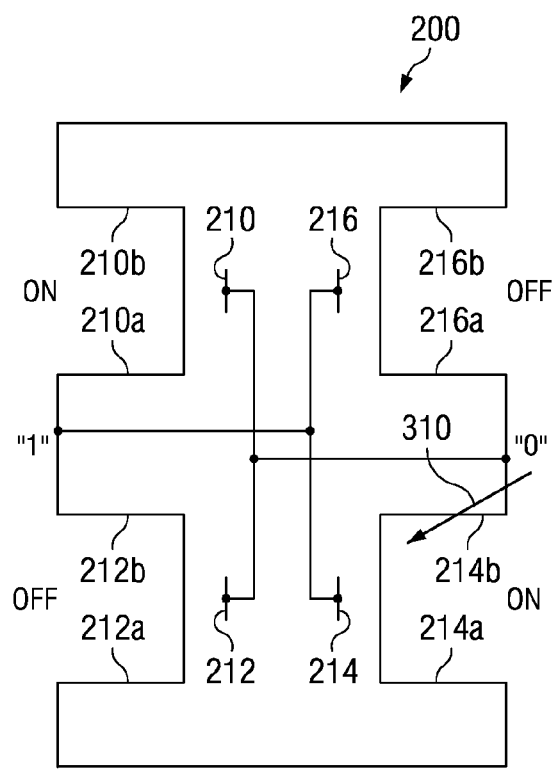
FIG. 3 is a schematic illustration of the memory circuit of FIG. 2 after sub-atomic particle impact in which the states of the nodes are flipped.

FIG. 3 represents the same memory circuit 200, but after a charged sub-atomic particle 310 has hit the drain 214b of the NMOS device. Without the benefits afforded by the present invention, the sub-atomic particle 310 can impart enough energy into the drain 214b to cause it flip or change states. As discussed above, the amount of linear energy transfer, which can be expressed in $meV/(mg/cm^2)$, imparted to the drain 214b that is required to flip the memory circuit 200, varies depending on the memory circuit's design and operating voltage. For example, if the memory circuit 200 has a higher operating voltage, the amount of energy required to flip the memory circuit 200 may be greater than for a memory circuit having a much lower operating voltage. For example in one exemplary embodiment, the linear energy transfer rate should not be greater than about 1 $meV/(mg/cm^2)$. As seen in the example illustrated in FIG. 3, following the charged sub-atomic particle strike, the NMOS side of the device now has a "0" stored therein, while the PMOS side has a "1" stored therein. This "on"/"off" configuration is opposite to that shown in FIG. 2, and when such occurrences happen, the original information stored in the memory circuit 200 is lost, thereby causing a soft error. For simplicity, the preceding discussion has been directed to a single node and a single sub-atomic particle. Of course, in day-to-day instances, many nodes will be struck by numerous sub-atomic particles. However, the present invention provides all of the integrated circuits nodes with adequate projection from multiple bombardments.

It has presently been found that the amount of linear energy transferred into the source or drain region 135, 137 can be changed by altering the position of the overlying structures located in the interlevel metal dielectric layers relative to the nodes (e.g., source/drain regions) of the integrated circuit 100. It is well know that each material from which the integrated circuit is constructed has associated with it a rate of energy loss per unit distance along the particle's path. It is equally well known that the stopping power of a medium is proportional to the mass M, and to the square of atomic number, $Z^2$, of the atoms in the medium. Thus, a medium consisting of heavy atoms have high stopping power. However, the stopping power is inversely proportional to the energy of the particle.

A fast moving particle deposits less energy per unit length on its track. Higher stopping power results in generating high ion pair density. As an alpha particle losses its energy, the stopping power increases. At the end of its path, the stopping power is the highest. Thus, along the particle's path, the ion pair density is the highest at the end of the path, or stated otherwise, the peak energy of the particle occurs at the end of the particle's path. Because of the ion pair density is highest at the particle's peak energy, the present invention recognizes that it is highly desirable that the structures be arranged relative to the node such that the peak energy occurs either before encountering the node or after it passes through the node.

The structures that can be moved relative to the nodes include any structure found in an integrated circuit, such as those mentioned above, including a layer of material that can be added or whose thickness might be adjustable. However, the examples discussed herein are directed primarily to interconnect structures or dummy features that might be present on any level of the integrated circuit.

Figure 4:
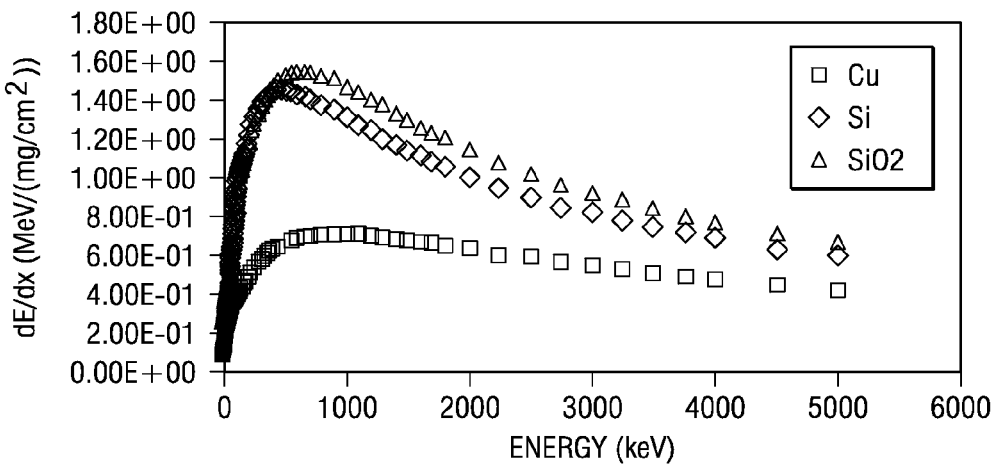
FIG. 4 graphically illustrates the stopping power of some of the materials, such as silicon, silicon dioxide, and copper, that are typically found in semiconductor devices.

FIG. 4 graphically illustrates the stopping power of some of the materials, such as silicon, silicon dioxide, and copper that are typically found in semiconductor devices. Other materials, however, include aluminum, silicon nitride and various metal nitrides. As seen from FIG. 4, the peak energy or stopping power is different for each material and is represented by the change in energy per unit length of the material through which the particle travels. Thus, to determine the peak energy of a sub-atomic particle when it reaches the node, the thickness of the stack of materials through which the particle will travel as a function of the energy and the energy loss must be calculated. This calculation can be achieved by using an algorithm implemented within a software program. Given the teachings of the present invention, one who is skilled in the art of modeling integrated circuits would be able to develop the necessary algorithm and software. For example, the program could be written to conduct a layout analysis of the integrated circuit and then trace a hypothetical path of an alpha particle from the very top level of the integrated circuit to the surface of the drain area of the sensitive node. Once the hypothetical path is found, energy loss curves of the materials that would be encountered by the alpha particle could be used to determine what energy the alpha particle might have when it reaches a sensitive node. Then, the program would loop through all the possible layout designs to arrive at the most optimal energy loss rate at the surface of the sensitive node.

Figure 5:
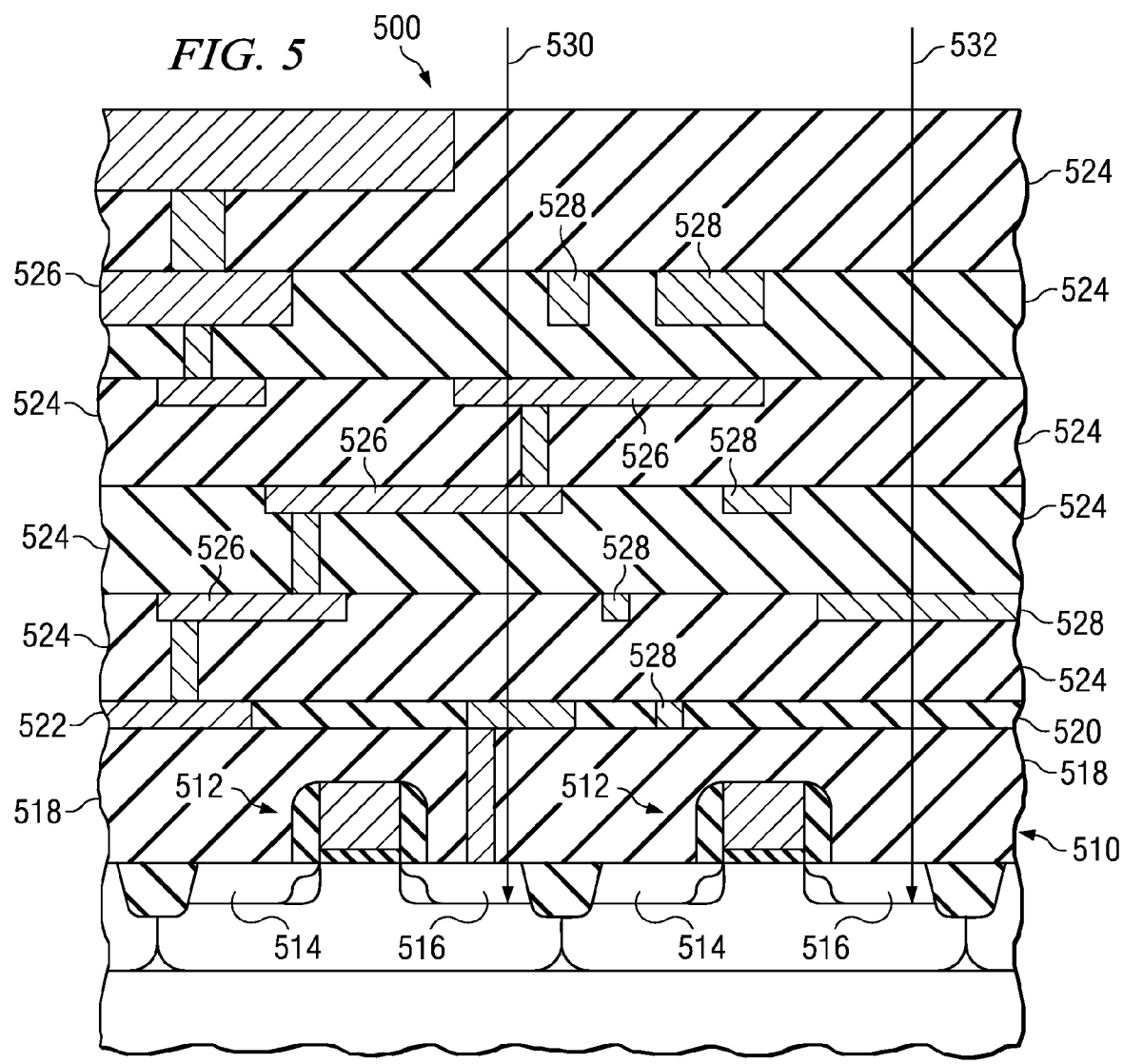
FIG. 5 illustrates a partial sectional view of a multi-layered integrated circuit design prior to reconfiguration to reduce a soft error rate.

By way of further illustration of an advantageous embodiment provided by the present invention, attention is now directed to FIG. 5, which is a partial sectional view of a multi-layered integrated circuit 500 design. The integrated circuit 500 comprises an active level 510 that includes conventionally formed transistors 512 that have source/drains 514, 516, respectively, as discussed above. Located directly over the transistors 512 is a pre-metal dielectric layer 518, and a metal isolation dielectric layer 520 in which interconnects 522 are located, is located over the pre-metal dielectric layer 518. The metal interconnects 522 may comprise copper, while pre-metal dielectric layer 518 and the metal isolation layer 520 may comprise phosphorous silicate glass and fluorosilicate glass, respectively. It should be understood that while FIG. 5 does not illustrate them, the integrated circuit 500 will includes the appropriate barrier layers in the interconnects and between the various dielectric layers.

Interlevel dielectric layers 524 are sequentially shown over the metal isolation layer 520, and interconnect structures 526 are formed within those various interlevel dielectric layers 524. As with previous layers, the interconnects may comprise copper or other conductive metals, such as aluminum, and the interlevel dielectric layers 526 may comprise fluorosilicate glass. However, the interlevel dielectric layer 526 may also include non-interconnect structures 528, such as metallic dummy features that are present for purposes of achieving more uniform planarization across the device, or other structures, such as capacitors, inductors, or resistors.

Also illustrated in FIG. 5 are sub-atomic particles 530 and 532. Their respective hypothetical paths are represented by the arrows that project through the various layers of materials to the nodes of the integrated circuit 500. As seen in this exemplary embodiment, the sub-atomic particle 530 travels through more material than the sub-atomic particle 532, as such, its peak energy will occur at a different point within the integrated circuit than the sub-atomic particle 532. At this point in the design process, the algorithm mentioned above could be used to determine if the peak energy curve of the particles would occur at the nodes. If so, then the program would go through a loop to move various structures around on various levels. What might result is the partial sectional view shown in FIG. 6.

Figure 6:
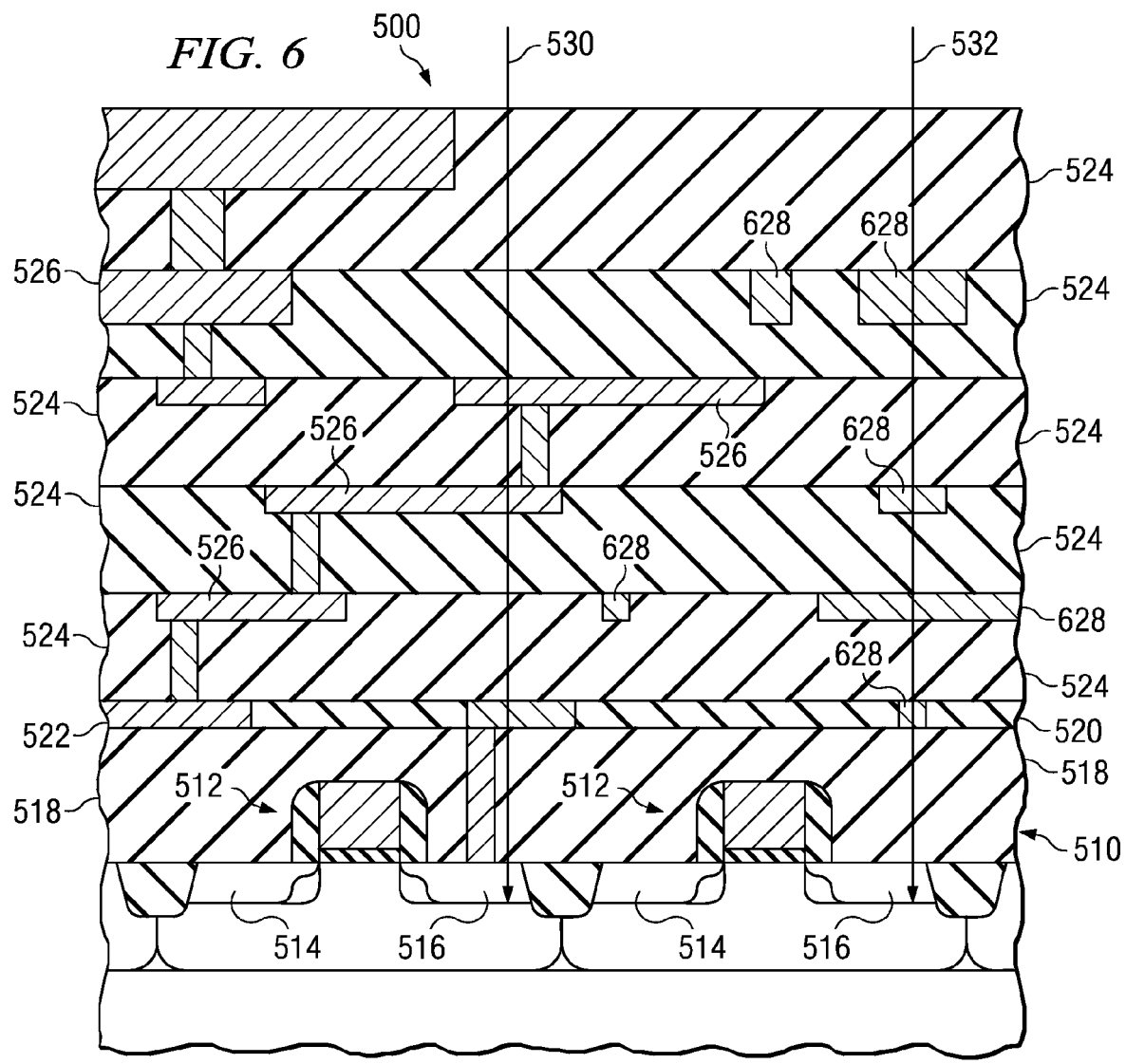
FIG. 6 illustrates the partial sectional view of the multi-layered integrated circuit of FIG. 5 after reconfiguration to reduce a soft error rate.

As seen in the hypothetical model illustrated in FIG. 6, several of the interconnect structures 526 or other features 628 have been moved to better shield the drain node 516, and thereby, reduce the soft error rate. A re-calculation would then be conducted to determine if the peak energy would occur at the nodes 516. This process would be repeated until the peak energy at the various nodes would be reduced to the point where the minimum number of soft errors or no soft errors would occur. It should be understood that the above-described embodiment may involve moving structures into the hypothetical paths or moving structures out of the hypothetical paths. In either case, the structures are moved relative to the nodes for the purpose of reducing the soft error rate.

Thus, the present provides a method and a device made by that method that provides shielding within the integrated circuit itself. Structures are modeled to provide a layout that forms an internal shield from sub-atomic particles such that when a sub-atomic particle encounters a node of the integrated circuit, the energy imparted by the sub-atomic particle does not exceed a threshold value associated with the integrated circuit.

Although the present invention has been described in detail, one who is of ordinary skill in the art should understand that they can make various changes, substitutions, and alterations herein without departing from the scope of the invention.

What is claimed is:

1. An integrated circuit, comprising:
 a semiconductor substrate having transistors located thereover, each of the transistors having source/drain regions associated therewith;
 dielectric layers located over the transistors; and
 an interconnect structure interconnecting the transistors and being located on or in the dielectric layers, at least a portion of the interconnect structure being located relative to the source/drain regions to reduce a linear energy transfer associated with sub-atomic particles into the source/drain regions such that the linear energy transfer does not exceed a threshold value associated with the integrated circuit.

2. The integrated circuit as recited in claim 1 wherein the threshold value does not exceed 1 meV/(mg/cm$^2$).

3. The integrated circuit as recited in claim 1 wherein at least one of the source/drain regions is susceptible to having a logic state changed as a result of an energy transfer from one or more of the sub-atomic particles.

4. The integrated circuit as recited in claim 3 wherein the integrated circuit comprises a memory circuit.

* * * * *